(12) United States Patent
Johnson et al.

(10) Patent No.: US 7,474,537 B2
(45) Date of Patent: Jan. 6, 2009

(54) CIRCUIT BOARD WITH MULTIPLE LAYER INTERCONNECT AND METHOD OF MANUFACTURE

(75) Inventors: Mark D. Johnson, Loveland, CO (US);
Michael G. Kelly, Loveland, CO (US);
Jeffrey P. Tobin, Loveland, CO (US);
William H. Sisson, Loveland, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/215,509

(22) Filed: Aug. 30, 2005

(65) Prior Publication Data

US 2007/0047213 A1    Mar. 1, 2007

(51) Int. Cl.
*H05K 7/00* (2006.01)
(52) U.S. Cl. ...................................... 361/760
(58) Field of Classification Search ......... 361/760–761, 361/779, 784, 790, 792, 793, 803, 807; 428/209
See application file for complete search history.

(56) References Cited

U.S. PATENT DOCUMENTS

| | | | |
|---|---|---|---|
| 4,877,651 A | 10/1989 | Dory | |
| 6,239,385 B1 | 5/2001 | Schwiebert et al. | |
| 6,824,857 B2 | 11/2004 | Lochun et al. | |
| 2003/0027219 A1 | 2/2003 | Ilsley et al. | |
| 2003/0059987 A1 | 3/2003 | Sirringhaus et al. | |
| 2004/0209054 A1 | 10/2004 | Lochun et al. | |
| 2005/0026317 A1 | 2/2005 | Sirringhaus et al. | |
| 2005/0279986 A1* | 12/2005 | Punsalan et al. ............... 257/3 |

* cited by examiner

*Primary Examiner*—Javaid Nasri (57) ABSTRACT

A circuit board includes a substrate defining a substantially planar surface, a first electrical component, a second electrical component, and an interconnect. The first electrical component is coupled to the substrate. The second electrical component is spaced from the first electrical component and is coupled to the substrate. The interconnect is formed on the substantially planar surface of the substrate and extends between the first electrical component and the second electrical component. The interconnect is formed by at least two layers of a conductive material.

10 Claims, 6 Drawing Sheets

CIRCUIT BOARD WITH MULTIPLE LAYER INTERCONNECT AND METHOD OF MANUFACTURE

BACKGROUND

Electronic circuit boards typically include a substrate supporting a plurality of electrical components. Conductive interconnects extend between and are configured to electrically connect the electrical components. The interconnects are typically formed of a material and with a desired geometry to have a capacity suitable to transfer signals between the electrical components as required for the particular application for which the interconnect is being utilized. More specifically, the interconnects are defined with a conductivity, resistance, diameter, and length to reliably transfer signals between components within a desired time frame. The interconnects are typically formed of conductive wire, such as copper wire, gold wire, aluminum wire, etc. soldered to and/or embedded within the substrate and extending between the respective electrical components, such as an integrated circuit, solder pad, lead, via, etc.

As computer systems continue to decrease in size, it is desirable that circuit boards also become smaller. By decreasing the size of the circuit board, routing of interconnects between the various components on the substrate becomes increasingly difficult. More particularly, each of the interconnects must be placed closer to one another, which can lead to unwanted interference between the interconnects. In some instances, the close proximity between interconnect creates layout and other manufacturing problems.

For example, interconnects are typically placed upon and soldered to the substrate in a series of solder points along the length of the interconnect. As such, a soldering instrument must be able to access each interconnect to apply the solder. As interconnects are moved closer and closer together, it becomes more difficult for solder to be applied to each respective interconnect without applying solder to the neighboring interconnects. As such, a need exists for a generally precise method of installing interconnects between components upon a substrate surface.

SUMMARY

One aspect of the present invention relates to a circuit board. The circuit board includes a substrate defining a substantially planar surface, a first electrical component, a second electrical component, and an interconnect. The first electrical component is coupled to the substrate. The second electrical component is spaced from the first electrical component and is coupled to the substrate. The interconnect is formed on the substantially planar surface of the substrate and extends between the first electrical component and the second electrical component. The interconnect is formed by at least two layers of a conductive material.

BRIEF DESCRIPTION OF THE DRAWINGS

Embodiments of the invention are better understood with reference to the following drawings. Elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "above," "over," etc., is used with reference to the orientation of the Figures(S) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
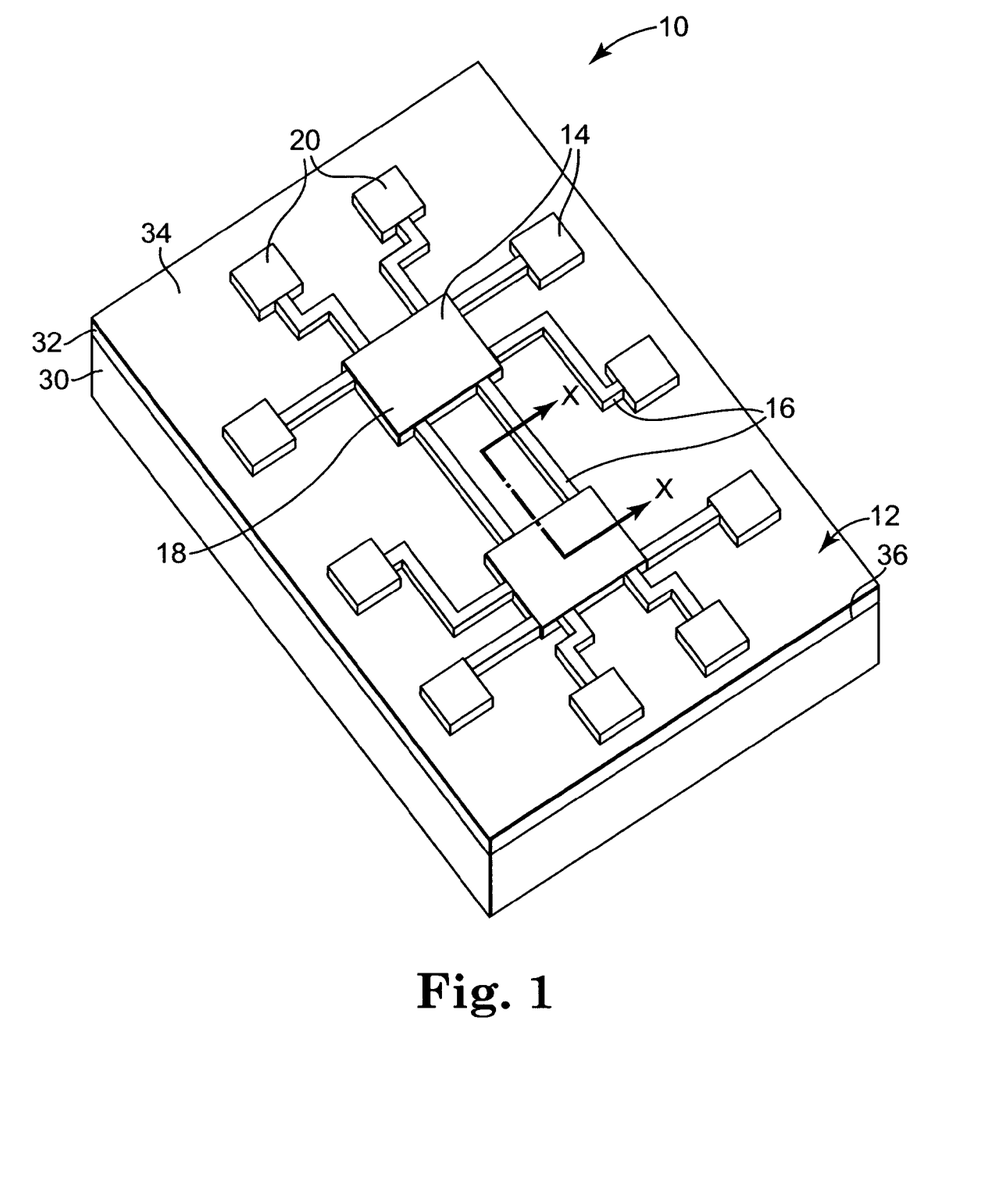
FIG. 1 is a perspective, schematic view illustrating one embodiment of a circuit board.

FIG. 1 is a perspective, schematic view of one embodiment of a circuit board 10. In one embodiment, circuit board 10 includes a substrate 12, electrical components 14, and interconnects 16. Electrical components 14 are embedded or soldered to substrate 12 and are generally spaced from one another. In one example, electrical components 14 include one or more of, but are not limited to, integrated circuits, such as integrated circuit 18, conductive pads, such as conductive pads 20, discrete components, etc. Each interconnect 16 extends between two or more electrical components 14. For example, an interconnect 16 extends between each integrated circuit 18 and a conductive pad 20. In one embodiment, the at least one interconnect 16 is deposited on substrate 12 in a plurality of layers. In one example, the plurality of layers are deposited to substrate 12 in a fluid ejection printing process.

Substrate 12 is any suitable insulating substrate generally configured to support electrical components 14. In one example, substrate 12 includes a non-conductive polymer. In one embodiment, substrate 12 includes a base member 30 and a surface coat 32. Base member 30 includes an insolating material and generally provides rigidity for circuit board 10. In one embodiment, substrate 12 consists solely of base member 30.

In one embodiment, at least a portion of electrical components 14 are coupled to base member 30. For example, electrical components 14 may be soldered or otherwise coupled to base member 30. In one example, base member 30 is initially provided in a clay-like state and electrical components 14 are at least partially embedded within based member 30. Once electrical components 14 are in place, base member 30 is cured by one or more of heat curing, radio frequency curing, or other suitable curing process to form a rigid base member 30. In one embodiment, electrical components 14 include one or more integrated circuits 18, such as application-specific integrated circuits, generally surrounded by a plurality of conductive pads 20.

In one embodiment, surface coat 32 is configured to be applied to base member 30 to form a substantially flat or planar surface 34 of substrate. More particularly, surface coat 32 is applied over a surface 36 of base member 30 to form planar surface 34. In one embodiment, one or more of the electrical components 14 is coupled to or embedded within base member 30 prior to application of surface coat 32. In this embodiment, following coupling of electrical components 14 with base member 30, a surface coat 32 is applied to base member 30 to at least partially envelop the electrical components 14. For example, in one embodiment, surface coat 32 is applied to base member 30 in a viscous or liquid configuration, is leveled with a suitable leveling method, such as spin coating, etc., and is cured to form a hard surface coat 32. In one embodiment, curing surface coat 32 includes heat curing, electronic curing, radio frequency curing, and/or other suitable curing method.

In one embodiment, upon curing of surface coat 32, each electrical component 14 is embedded at least partially within surface coat 32. In such embodiments, at least a portion of each electrical component 14 extends beyond (i.e., above) surface 34 providing an electrical contact area for interacting with interconnect 16. In another embodiment, one or more electrical components 14 are applied to surface 34 after the application of surface coat 32. For example, conductive pads 20 may be applied to surface 34 as a conductive foil, such as a gold foil, copper foil, aluminum foil, etc. In one embodiment, where surface 36 of base member 30 is substantially planar, no surface coat 32 is included in substrate 12.

Interconnects 16 are formed with desired conductive properties to facilitate transfer of electrical signals between electrical components 14. In one embodiment, interconnects 16 are formed with an overall length to facilitate the proper timing of transferred signals. Interconnects 16 are formed in a layering process. More specifically, layers of interconnect 16 are sequentially stacked on one another to form interconnect 16 with a desired overall thickness (i.e., to extend a desired distance from surface 34 or 36). In one example, interconnects 16 are formed of a conductive material, such as a conductive polymer or other suitable material. In one embodiment, interconnects 16 are each deposited to surface 34 or 36 via fluid ejection printing, which ejects conductive fluid onto substrate 12 to form interconnects 16. Fluid ejection printing is similar to inkjet printing where conductive fluid is used instead of ink and substrate 12 replaces the print media.

As such, in one example, interconnects 16 are formed of a conductive material with a substantially flowable initial state that is subsequently cured or dried to form solid interconnects 16. In one embodiment, the connection between an electrical component 14 and an interconnect 16 is further substantiated by soldering the connection where interconnect 16 interfaces with electrical component 14. In other embodiments, the connection between electrical component 14 and interconnect 16 is accomplished with the use of electrically conductive adhesives. In other embodiments, printing of interconnect 16 is configured to fully form the connection between electrical component 14 and interconnect 16.

Figure 2:
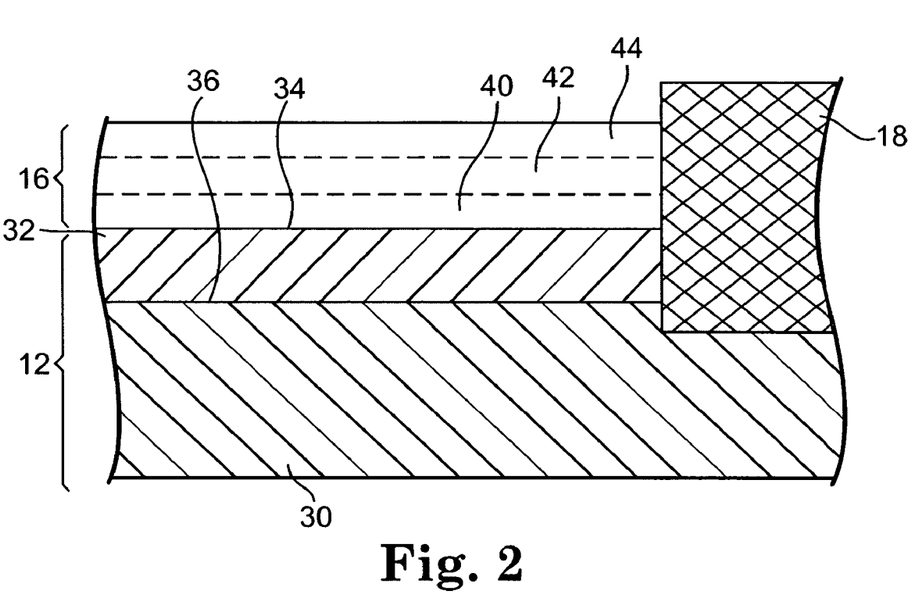
FIG. 2 is a cross-sectional view of a portion of the circuit board of FIG. 1 taken along the lines X-X.

FIG. 2 is a cross sectional view of the circuit board 10 of FIG. 1 illustrating an interconnect 16 formed on surface 34 of substrate 12. In particular, interconnect 16 is formed of at least two layers, such as three layers 40, 42, and 44. In one embodiment, integrated circuit 18 is partially embedded within substrate 12. A portion of integrated circuit 18 extends beyond (i.e., above) surface 34 of substrate 12. The portion of integrated circuit 18 extending above substrate 12 permits electronic coupling of surface deposited interconnects 16 with the integrated circuit 18.

More specifically, first layer 40 is formed of a conductive material, such as a conductive polymer. In one example, first layer 40 is formed of a conductive fluid including a conductive polymer. First layer 40 is deposited on surface 34 of substrate 12 and cured with heat, radio frequency, electricity, or other suitable curing method. In one example, first layer 40 is applied on substrate 12 to extend between integrated circuit 18 and another electrical component 14, in this case, between two integrated circuits 18 as illustrated with additional reference to FIG. 1, in a desired path. First layer 40 is also applied to substrate 12 with a desired width. In one embodiment, the width and defined path of the deposed first layer 40 is determined by a circuit board designer and configured to transfer electrical signals between the respective integrated circuit 18 and other electrical component 14 as desired. Although primarily described as being deposited on surface 34 of substrate 12, it should be understood throughout this description that in embodiments in which no surface coat 32 is utilized, interconnects 16 are deposed on surface 36 of base member 30.

Once first layer 40 has at least partially cured or solidified, second layer 42 is deposited on first layer 40. More specifically, second layer 42 is formed of a conductive material, such as a conductive polymer. In one example, second layer 42 is formed of a conductive fluid including a conductive polymer, such as the conductive fluid of first layer 40. Second layer 42 is deposited on top of first layer 40 and cured with heat, radio frequency, electricity, or other suitable curing method. In this manner, the thickness that interconnect 16 extends above surface 34 of substrate 12 is increased as each layer 40, 42, and 44 is deposited. In one embodiment, layers 40, 42, and 44 are formed by fluid ejection printing where the fluid ejection printhead makes multiple passes over substrate 12.

Although generally described above as forming second layer 42 entirely on top of first layer 40, in one embodiment, second layer 42 may be deposited on top of first layer 40 in a manner at least partially extending around a width of first layer 40 to additionally contact substrate surface 34. In one embodiment, additional layers, such as a third layer 44, are deposited after each previous layer has at least partially cured. In one example, after all layers 40, 42, and 44 have cured or solidified, layers 40, 42, and 44 collectively define interconnect 16 with a substantially rectangular cross-section.

Once each layer 40, 42, and 44 has fully cured, layers 40, 42, and 44 collectively define interconnect 16 and are collectively configured to transfer signals between electrical components 14. In one embodiment, the composition of layers 40, 42, and 44 is configured to decrease additional signal resistance of interconnect 16 created at borders between adjacent layers 40, 42, and 44. In one embodiment, each layer 40, 42, and 44 is only partially cured prior to deposition of a subsequent layer 42 or 44 to decrease any additional resistance at borders between adjacent layers 40, 42, and 44. Other suitable methods of decreasing the impact of adjacent layer borders on electrical signal transmissions are also contemplated.

Figure 3:
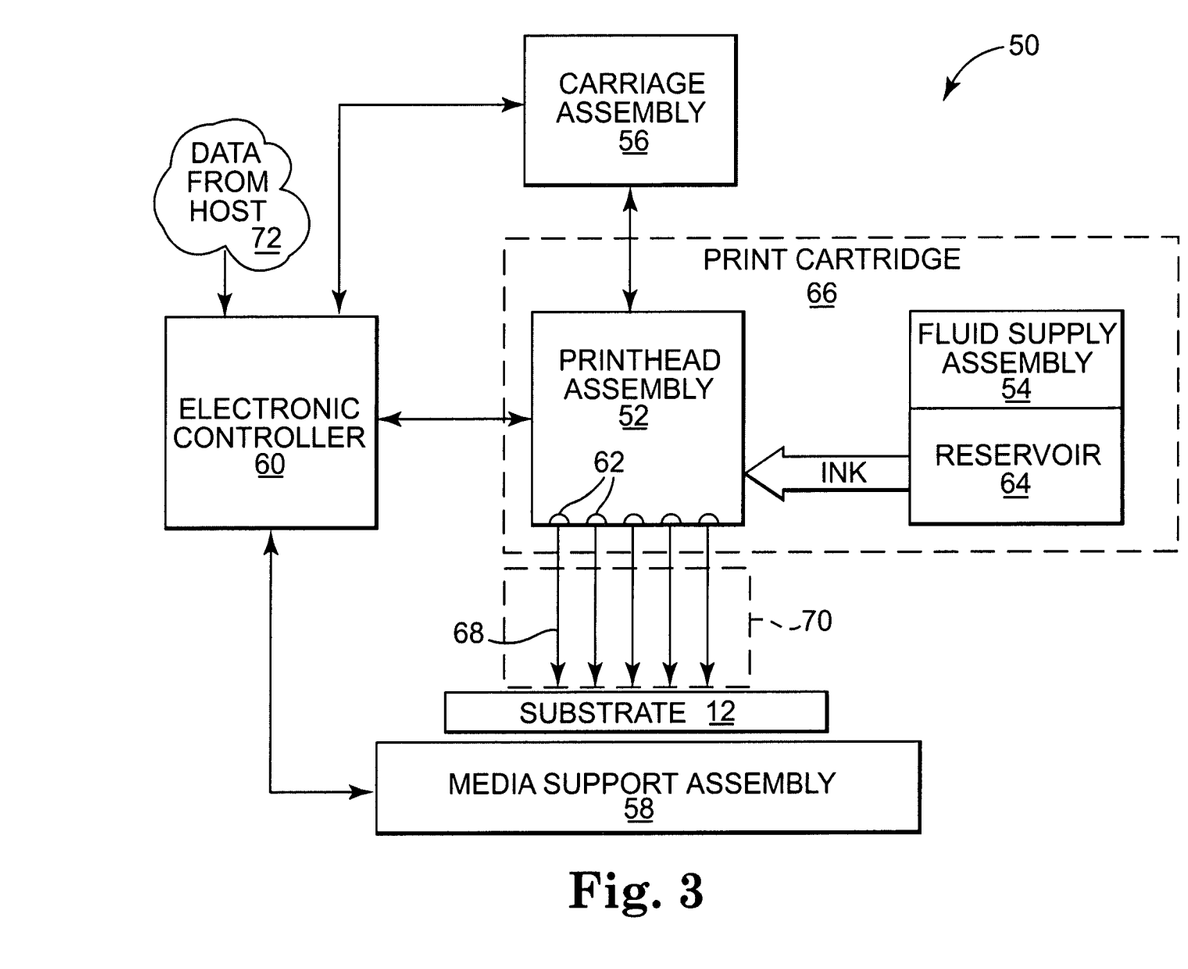
FIG. 3 is a block diagram illustrating one embodiment of a printing system.

FIG. 3 illustrates one embodiment of a printing system 50 for printing interconnect 16 onto substrate 12. Printing system 50 includes a print head assembly 52, an fluid supply assembly 54, a carriage assembly 56, a media transport assembly 58, and an electronic controller 60. Print head assembly 52 includes a print head which ejects drops of conductive fluid through a plurality of orifices or nozzles 62 and toward substrate 12 so as to print onto substrate 12. Typically, nozzles 62 are arranged in one or more columns or arrays such that properly sequenced ejection of conductive fluid from nozzles 62 causes lines, shapes, etc. representing the interconnect path to be printed upon substrate 12 as print head assembly 52 and substrate 12 are moved relative to each other.

The printhead ejects the fluid drops through the nozzles 62 by rapidly heating a small volume of fluid located in vaporization chambers with small electric heaters, such as thin film resisters. Heating the fluid causes the fluid to vaporize and be ejected from nozzles 62. Typically, for one drop of fluid, electronic controller 60 controls activation of an electrical current from a power supply external to the printhead. The electrical current is passed through a selected thin film resister to heat the fluid in a corresponding selected vaporization chamber and to form a drop of fluid for ejection toward substrate 12.

Fluid supply assembly 54 supplies conductive fluid to print head assembly 52 and includes a reservoir 64 for storing the conductive fluid. In one embodiment, the conductive fluid includes a conductive polymer having conductive and low resistance properties suitable for use in the particular application. As such, conductive fluid flows from reservoir 64 to print head assembly 52. In one embodiment, print head assembly 52 and conductive fluid supply assembly 54 are housed together in a fluid ejectionprint cartridge or pen as defined by dashed line 66. In another embodiment, fluid supply assembly 54 is separate from print head assembly 52 and supplies conductive fluid to print head assembly 52. In either embodiment, reservoir 64 of fluid supply assembly 54 may be removed, replaced, and/or refilled.

In one embodiment, carriage assembly 56 positions print head assembly 52 relative to media transport assembly 58, and media transport assembly 58 positions substrate 12 relative to print head assembly 52. Thus, a conductive fluid is ejected toward substrate 12 as generally indicated by arrows 68. As such, a print zone 70 is defined adjacent to nozzles 62 in an area between print head assembly 52 and substrate 12. In a scanning type printing system, carriage assembly 56 moves print head assembly 52 relative to media transport assembly 58 to scan substrate 12. In another embodiment, one of print head assembly 12 and media transport assembly 58 are held relatively stationary while the other of print head assembly 52 and media transport assembly 58 moves to position print head assembly 52 relative to substrate 12.

Electronic controller 60 communicates with print head assembly 52, carriage assembly 56, and media transport assembly 58. Electronic controller 60 receives data 72 from a host system, such as a computer, and includes memory for temporarily storing data 72. Data 72 represents, for example, a pattern or arrangement of interconnects to be printed to substrate 12. In one embodiment, data 72 defines the interconnect path and a width for each interconnect to be printed to substrate 12. As such, data 72 forms a print job for printing system 50 and includes one or more print job commands and/or command parameters.

Electronic controller 60 provides control of print head assembly 52 including the timing control for ejection of fluid drops from nozzles 62. As such, electronic controller 60 defines a pattern of ejected fluid drops which collectively form the desired pattern or arrangement of interconnects on substrate 12. Timing control and, therefore, the pattern of ejected fluid drops are determined by the print job commands and/or command parameters.

Figure 4:
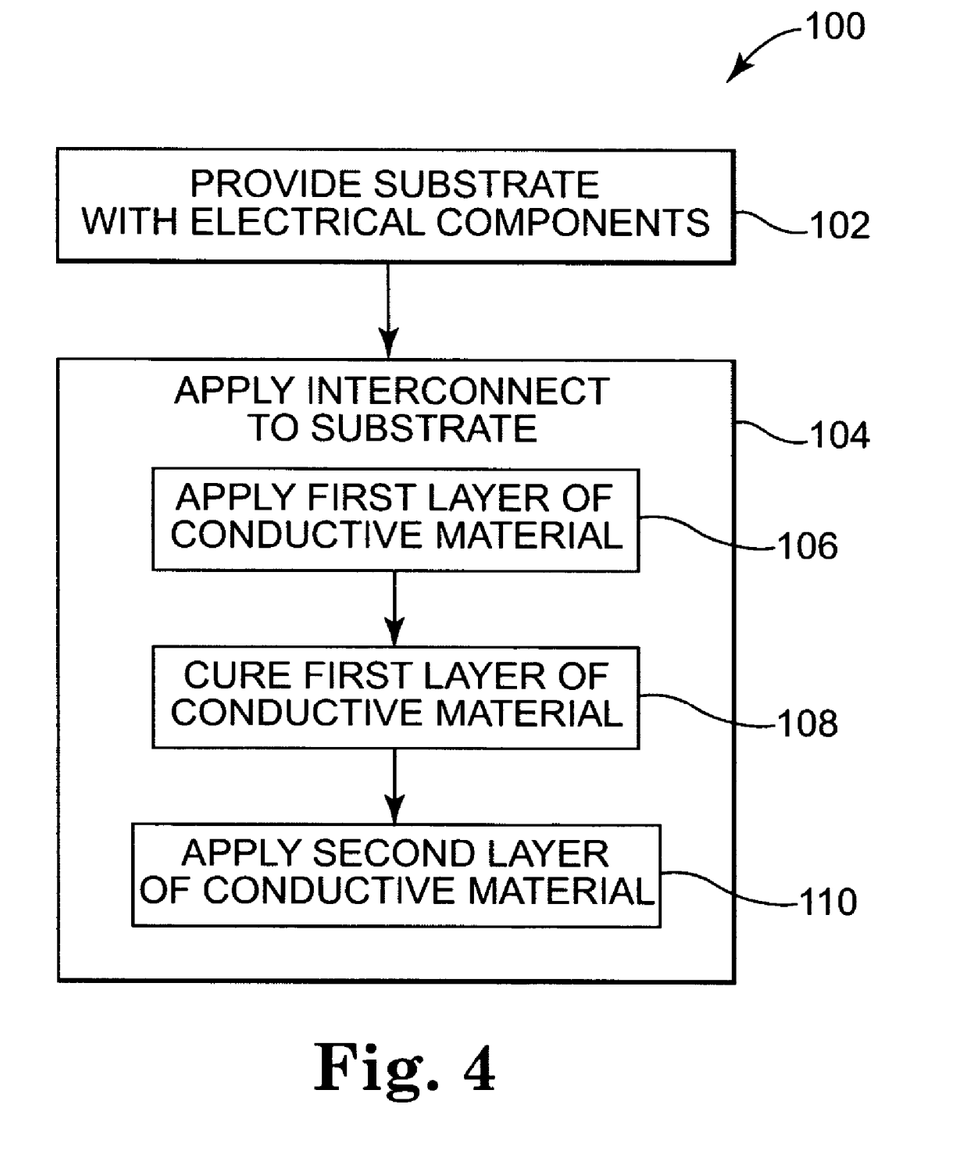
FIG. 4 is a flow chart illustrating one embodiment of a method of manufacturing a circuit board.

FIG. 4 is a flow chart generally illustrating one embodiment of a method of manufacturing a circuit board 100. Referring to FIG. 4 in view of FIGS. 1 and 2, method 100 begins at 102 where a substrate 12 is provided with electrical components 14. At 104, at least one interconnect is applied to the provided substrate 12. In one example, applying the at least one interconnect includes applying a first layer 40 of the conductive material to substrate 12. At 108, first layer 40 of conductive material is cured in a suitable method as described above. At 110, a second layer 42 of conductive material is applied on first layer 40 after first layer 40 has at least partially cured at 108.

Figure 5:
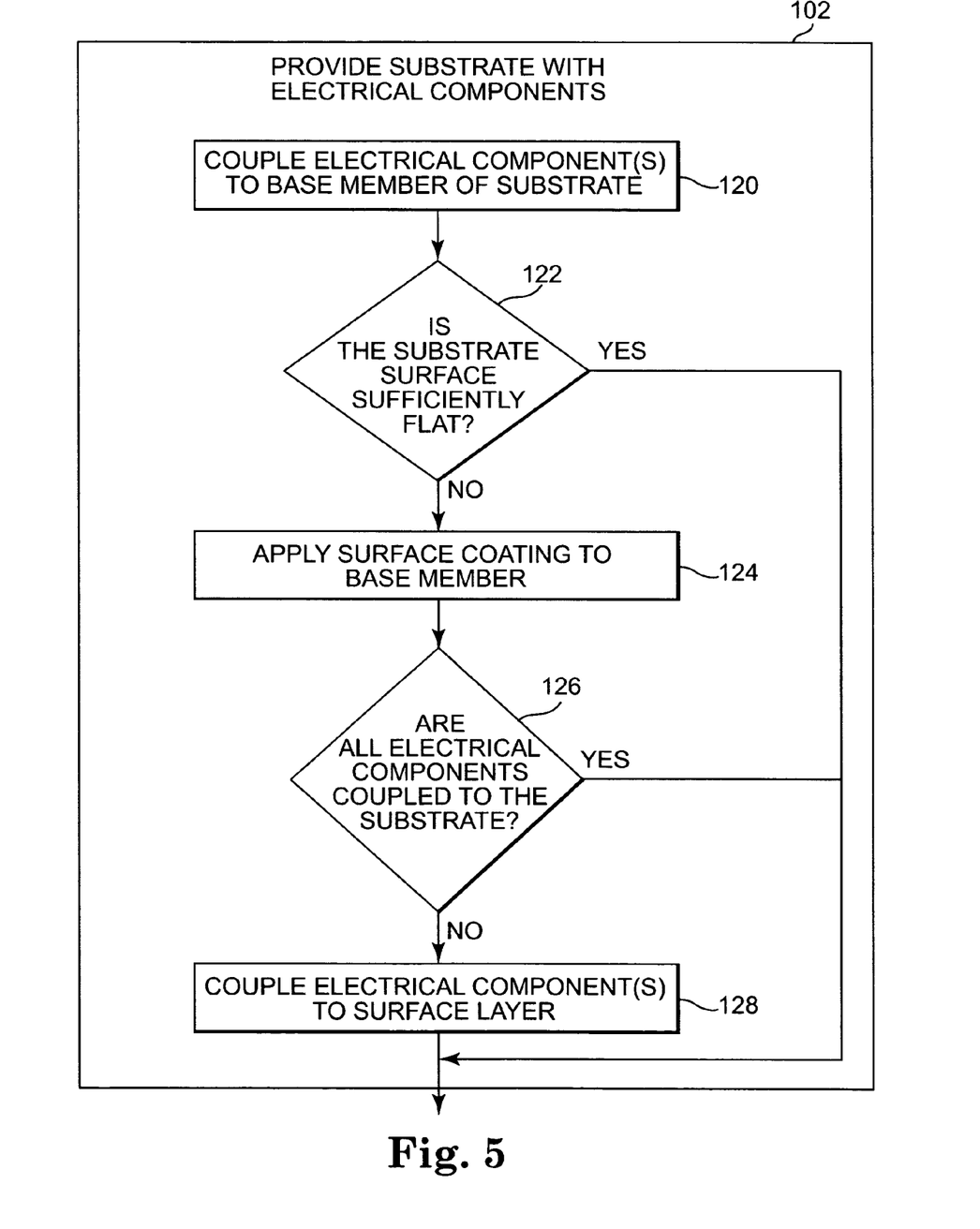
FIG. 5 is a flow chart illustrating a one embodiment of a method of providing a substrate with electrical components as part of the method of FIG. 4.

FIG. 5 is a flow chart more particularly illustrating a method of providing a substrate with electrical components 102 as included in the manufacturing method 100 of FIG. 4. Referring to FIG. 5 in view of FIGS. 1 and 2, at 120, at least a portion of the electrical components 14 are coupled to surface 36 of and/or are embedded at least partially within base member 30. Electrical components 14 are arranged on substrate 12 in accordance a particular application for which circuit board 10 is being manufactured.

At 122, it is determined if surface 36 of base member 30 is sufficiently flat or planar to receive deposited interconnects 16 with a desired level of precision and reliability. If surface 36 is sufficiently flat, then the method of providing substrate 12 with electrical components 14 is substantially completed. If, at 122, it is determined that surface 36 is not sufficiently flat or if it is otherwise desired to include surface coat 32, then at 124, surface coat 32 is applied to surface 36 of base member 30. In one example, surface coat 32 is applied in a flowable form and is configured to self-level itself upon surface 34. In another embodiment, during application and/or curing of surface coat 32, surface coat 32 is spun or otherwise leveled on base member 30 to define surface 34 as a substantially planar surface prepared for receiving interconnects 16.

In one embodiment, surface coat 32 is configured to be formed around electrical components 14 that have already been secured to substrate 12, more specifically, to base member 30. In one example, surface coat 32 is applied with a thickness configured to surround electrical components 14 without fully enveloping each electrical component 14. In this manner, a portion of each electrical component 14 extends above surface 34 and is configured to be coupled with interconnects 16 that will subsequently be formed on surface 34, for example, as illustrated with reference to integrated circuit 18 illustrated in FIG. 2.

At 126, it is determined if all electrical components 16 are coupled with substrate 12. If all electrical components 16 have been coupled with substrate 12, then the method of providing substrate 12 with electrical components 14 is substantially completed. If, at 126, it is determined that additional electrical components 14 remain to be coupled to substrate 12, then, at 128, any remaining electrical components 14 are coupled to substrate 12. In one example, electrical components 14 such as leads, pads, or other soldering components are applied to surface 34 in a manner consistent with the end application for which circuit board 10 is designed.

Figure 6:
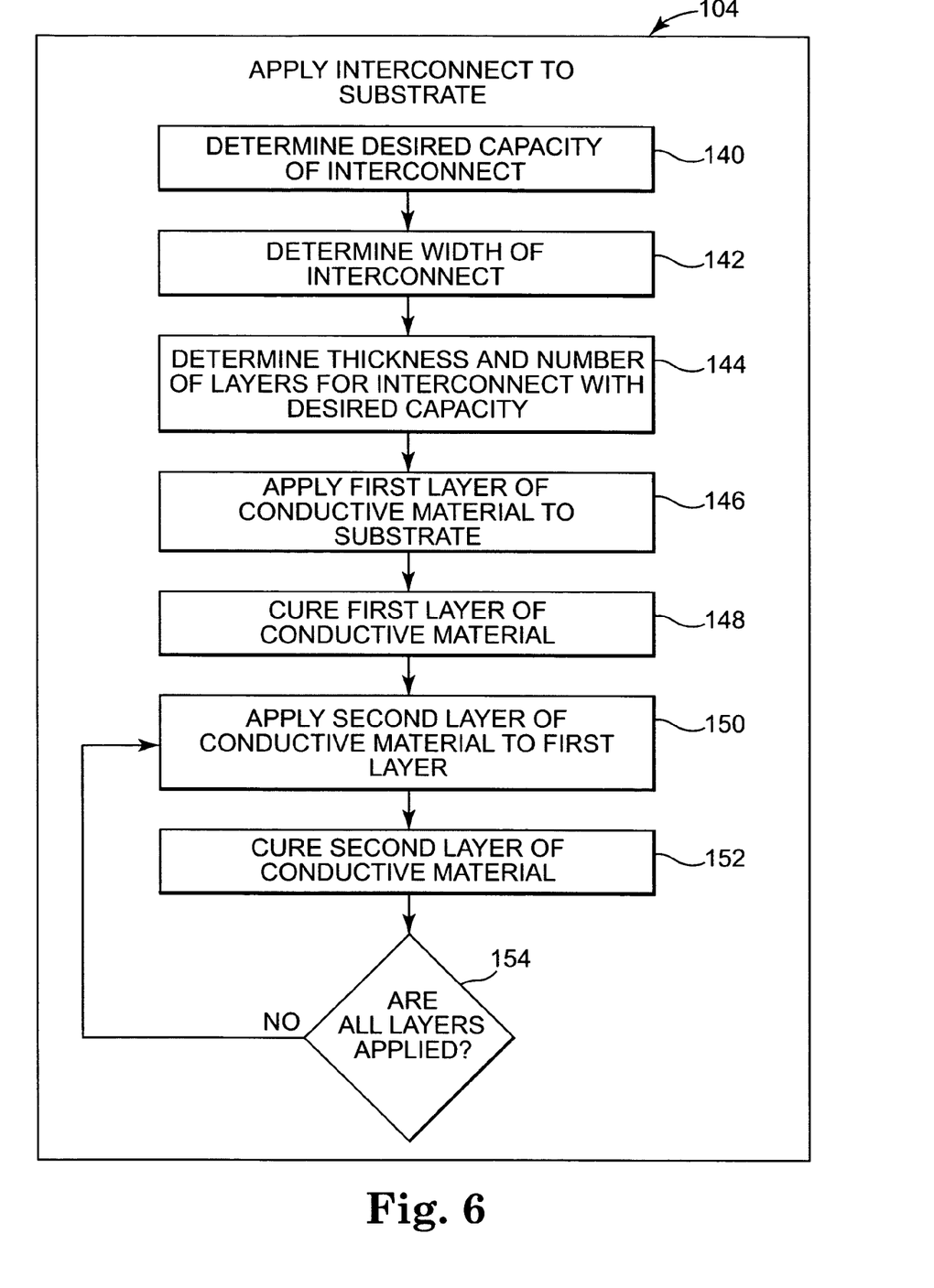
FIG. 6 is a flow chart illustrating one embodiment of a method of applying an interconnect to a substrate as part of the method of FIG. 4.

FIG. 6 is a flow chart more particularly illustrating one embodiment of applying an interconnect to a substrate generally at 104 as included in method 100 of FIG. 4. Referring to FIG. 6 in view of FIGS. 1 and 2, at 140, a desired capacity of the interconnect 16 to be formed is determined. The desired capacity is based upon the particular application for which circuit board 10 is being manufactured and the predicted communication levels between electrical components 14 that are electrically coupled by interconnect 16.

At 142, a desired width of interconnect 16 is determined based upon the surface area available on substrate surface 34. In one embodiment, the width of interconnect 16 is further determined in view of the desired capacity of the interconnect as determined at 140, in view of the conductive properties of the conductive material being used to form interconnect 16, and/or in view of a maximum thickness for interconnect 16.

At 144, the thickness of interconnect 16 is determined. In one embodiment, the width and thickness of interconnect 16 are determined at 142 and 144 in a substantially simultaneous manner since each value is generally at least somewhat dependent upon the other. In one embodiment, the thickness of interconnect 16 is determined in view of the desired capacity of the interconnect as determined at 140, in view of the conductive properties of the conductive material being used to form interconnect 16, and/or in view of the width of or available surface area width on substrate 12 for interconnect 16. In one embodiment, determining the width and the thickness of interconnect 16 includes utilizing conventional interconnect design practices.

As such, the cross-sectional area of interconnect 16, which is determined by the width and overall thickness of interconnect 16, is designed in view of the conductivity of the material used to form interconnect 16 such that interconnect 16 has the desired capacity to transfer electrical signals for the particular application. Accordingly, the width and thickness of interconnect are selected to accommodate the desired capacity. In one embodiment, interconnect 16 is formed with a relatively large cross-sectional area to account for any additional resistance along interconnect 16 that may be occurred at the borders between adjacent layers 40, 42, and 44 of interconnect 16.

Once the desired thickness of interconnect 16 is determined the number of layers of interconnect 16 is also determined. The number of layers is at least partially dependent upon the thickness of each layer to be deposited. In a simplified example, where the desired thickness of interconnect 16 is divided by the thickness of a single deposited layer to determine the number of layers that will be deposited on substrate 12 to collectively define interconnect 16.

At 146, first layer 40 of a conductive material, such as a conductive fluid or other material including a conductive polymer, is applied to surface 34 of substrate 12. In one embodiment, first layer 40 is deposited in a fluid ejection printing process, for example, with printing system 50 of FIG. 3. First layer 40 is deposited in a desired pattern between electrical components 14 and with the width determined at 142. In one embodiment, first layer 40 is deposited so as to be in electrical communication with at least two electrical components 14. At 148, first layer 40 is at least partially cured in any one or more of the suitable curing methods described above. In particular, first layer 40 is cured at least until first layer 40 is sufficiently solid or dried to support a subsequent layer of the conductive material.

At 150, second layer 42 is applied on and/or partially around first layer 40. In one embodiment, second layer 42 and first layer 40 are each formed of a substantially similar conductive material. In one example, second layer 42 is deposited in a fluid ejection printing process similar to first layer 40 as described above. At 152, second layer 42 is at least partially cured in an one or more of the suitable curing methods described above. In particular, second layer 42 is cured at least until second layer 42 is sufficiently solid to support a subsequent layer of the conductive material.

At 154, it is determined if all layers of interconnect 16 have been applied. If all layers have been applied, then interconnect 16 is collectively defined by the applied layers. If all layers have not been applied, then operations 150 and 152 are repeated as necessary until interconnect 16 is fully defined by a number of layers as determined at 144. In one embodiment, an optional protective coating is applied over substrate surface 34, electrical components 14, and interconnects 16.

Interconnects formed in a manner consistent with the above description can be designed with increased flexibility as compared with prior art interconnects. Layered interconnects can be formed with a desirable capacity even where the available area on the substrate surface is limited. More particularly, the conductive material forming the interconnects can be modified and can be applied in various widths and thicknesses. As such, the material and geometry of each interconnect can be easily customized to achieve a desired signal capacity. In addition, use of a fluid ejection printing method for applying interconnects to a substrate also increases the precision at which interconnects can be applied to a substrate and may also increase the available pattern configurations in which interconnects can be formed.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit board comprising:
a substrate defining a substantially planar surface;
a first non-micro-electronic electrical component coupled to the substrate;
a second non-micro-electronic electrical component spaced from the first electrical component and coupled to the substrate;
an interconnect formed on the substantially planar surface of the substrate and extending between the first electrical component and the second electrical component, a first end of the interconnect being electrically connected to the first electrical component, a second end of the interconnect being electrically connected to the second electrical component, the interconnect establishing an electrical connection between the first electrical component and the second electrical component, the interconnect comprising at least two adjoining layers, each layer comprising a cured conductive polymer, the interconnect having a width and a thickness sufficient to permit the reliable transfer of electrical signals between the first electrical component and the second electrical component.

2. The circuit board of claim 1, wherein the conductive polymer is initially in a fluid form when applied to the substrate, and the interconnect is a fluid ejection printed structure formed by printing a first layer of conductive polymer on the substrate and subsequently printing a second layer of conductive polymer atop the first layer of conductive polymer.

3. The circuit board of claim 2, wherein the conductive polymer of the first layer is the same as the conductive polymer of the second layer.

4. The circuit board of claim 1, wherein the interconnect comprises more than two layers.

5. The circuit board of claim 1, further comprising at least one of solder and electrically conductive adhesive emplaced on at least one of the first end and the second end.

6. The circuit board of claim 1, wherein the substrate comprises a base member and a surface coat, the surface coat being configured to provide the planar surface to the substrate.

7. The circuit board of claim 1, wherein at least one of the first electrical component and the second electrical component is at least partially embedded within the substrate.

8. The circuit board of claim 1, wherein the interconnect comprises at least three layers of electrically conductive polymer.

9. The circuit board of claim 1, wherein at least one of the first electrical component and the second electrical component is at least one of an integrated circuit, an application specific integrated circuit, a conductive pad, and a discrete component.

10. The circuit board of claim 1, wherein the interconnect has an overall length selected to facilitate proper timing of signals transferred between the first electrical component and the second electrical component therethrough.

* * * * *